(12) United States Patent
Jenq

(10) Patent No.: US 6,204,146 B1
(45) Date of Patent: Mar. 20, 2001

(54) METHOD OF FABRICATING SHALLOW TRENCH ISOLATION

(75) Inventor: Jason J. S. Jenq, Pingtung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/210,273

(22) Filed: Dec. 10, 1998

(51) Int. Cl.⁷ .................................................. H01L 21/76
(52) U.S. Cl. .......................... 438/424; 438/435; 438/437
(58) Field of Search ................................... 438/437, 239, 438/424, 435, 243

(56) References Cited

U.S. PATENT DOCUMENTS

| | | | |
|---|---|---|---|
| 4,666,556 | * 5/1987 | Fulton et al. | 156/643 |
| 5,447,884 | * 9/1995 | Fahey et al. | 437/67 |
| 5,747,866 | * 5/1998 | Ho et al. | 257/506 |
| 5,766,971 | * 6/1998 | Ahlgren et al. | 437/67 |
| 5,837,612 | * 11/1998 | Ajuria et al. | 438/697 |
| 5,940,717 | * 8/1999 | Rengarajan et al. | 438/435 |

* cited by examiner

Primary Examiner—John F. Niebling
Assistant Examiner—Walter L. Lindsay, Jr.
(74) Attorney, Agent, or Firm—Oppenheimer Wolff & Donnelly LLP

(57) ABSTRACT

A method of fabricating a shallow isolation. The method comprises the step of forming a pad oxide layer and a mask layer over a substrate in turn. The mask layer is patterned. The pad oxide layer and the substrate are anisotropically etched by using the patterned mask layer as a hard mask in order to form a trench in the substrate. A rapid thermal processing annealing process under the $N_2$ or $NH_3$ is proceeding in order to form a silicon nitride layer on the substrate in the trench. The trench is filled with oxide to form the shallow trench isolation.

17 Claims, 2 Drawing Sheets

METHOD OF FABRICATING SHALLOW TRENCH ISOLATION

BACKGROUND OF THE INVENTION

1. Field of the Invention

The present invention relates in general to a method of fabricating shallow trench isolation (STI), and more specifically relates to a method of fabricating shallow trench isolation by using $SiN_x$ as a liner layer.

2. Description of Related Art

The device isolation structures are used to prevent the carriers from flowing between the adjacent devices through the substrate. The device isolation structures are formed between the adjacent field effect transistors (FETs) in dense semiconductor circuits, such as dynamic random access memories (DRAMs), to reduce charge leakage produced by FET. The most conventional and common technology for forming a field oxide region is the local oxidation of silicon (LOCOS). Due to the growth of the LOCOS technology, this technology has provided effective device isolation with an acceptable level of reliability. However, there are several drawbacks in LOCOS technology, especially the problems produced from the bird's beak. In a small device, the LOCOS field oxide structure cannot provide effective isolation. So, in high-density devices, it is replaced by shallow trench isolation that can be easily scalable.

The shallow trench isolation is a technology that a trench is formed in the substrate by using the anisotropic etching method. The trench is then filled with oxide to form the device field isolation structure. Because of the advantage of being able to scale and avoiding the drawbacks of bird's beak encroachment of the conventional LOCOS technology, shallow trench isolation is an ideal isolation technology for high integrated devices.

FIGS. 1A through 1C are schematic, cross-sectional views showing the process for forming shallow trench isolation according to a conventional method.

Referring to FIG. 1A, a pad oxide 102 is formed on the substrate 100 by using the thermal oxidation. Then a silicon nitride layer 104 is formed on the pad oxide layer 102 by using low-pressure chemical vapor deposition (LPCVD). The silicon nitride layer 104 is patterned. The silicon nitride layer 104, the pad oxide layer 102 and the substrate 100 are etched anisotropically to form a trench 106 on the substrate 100.

Referring to FIG. 1B, a liner oxide layer 108 is formed on the substrate 100 surface in the trench by thermal oxidation. An oxide layer 110 is formed over the mask layer 104 by atmospheric pressure chemical vapor deposition (APCVD) or high density plasma chemical vapor deposition (HDPCVD) and filling the trench 106 with oxide material. The densification step is proceeded to the oxide layer 110 under the high temperature of about 1000° C.

Referring to FIG. 1C, parts of the oxide layer 110 are removed by chemical mechanical polishing (CMP) by using the mask layer 104 as a polishing stop layer. The mask layer 104 and the pad oxide layer 102 are removed sequentially to form a plug 100a in the trench 106.

Whatever the oxide layer 110 is formed by APCVD or HDPCVD, the ions produced by chemical reactions or the charges produced by plasma are trapped by the liner oxide layer 108. This induces the remaining of static electricity. On the other hand, the non-bonided oxygen molecules in the reaction penetrate and diffuse into the active region of the substrate 100. This effects the conductivity of the devices.

In the U.S. Pat. No. 5,747,866, Ho et al. describe forming a silicon nitride layer over the liner oxide layer in order to prevent the above drawbacks. The formation of the silicon nitride layer includes that a silicon nitride layer is deposited and then put the substrate into the furnace to produce a high temperature anneal. However, the formation of the silicon nitride layer by furnace has the stress problem. The stress may cause the defects of the single crystal semiconductor substrate easily.

SUMMARY OF THE INVENTION

Accordingly, the invention provides a method of producing a shallow trench isolation to avoid the remaining of the static electricity.

The invention provides a method of producing a shallow trench isolation to avoid that the oxygen molecular penetrate and diffuse into the active region of the semiconductor substrate to effect the conductivity of the devices.

The invention provides a method of producing a shallow trench isolation to avoid the stress problem with making the semiconductor substrate defect.

The present invention achieves the above-identified objects by providing a method of fabricating shallow trench isolation. The method comprises the step of forming a pad oxide layer and a mask layer over a substrate in turn. The mask layer is patterned. The pad oxide layer and the substrate are anisotropically etched by using the patterned mask layer as a hard mask in order to form a trench in the substrate. A rapid thermal processing annealing process under the $N_2$ or $NH_3$ is carried out in order to form a silicon nitride layer on the substrate surface in the trench. The trench is filled with oxide to form the shallow trench isolation.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description made in connection with the accompanying drawings which:

DESCRIPTION OF THE PREFERRED EMBODIMENT

Figure 1A:
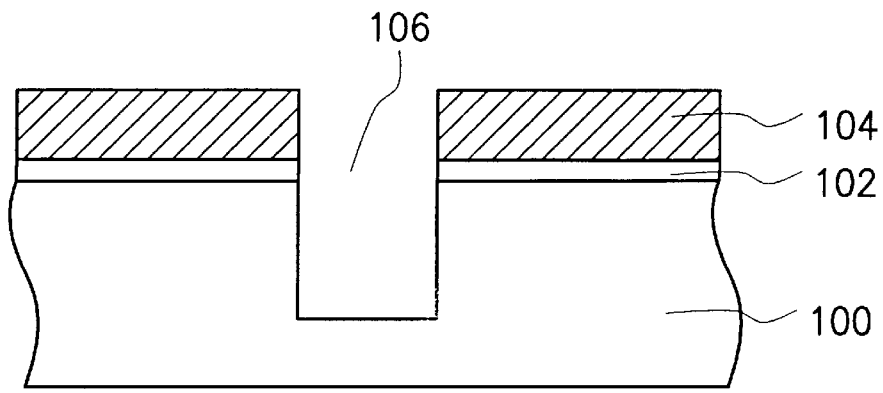
FIGS. 1A through 1C are schematic, cross-sectional drawings representing the process steps of forming shallow trench isolation according to the prior art.
Figure 1B:
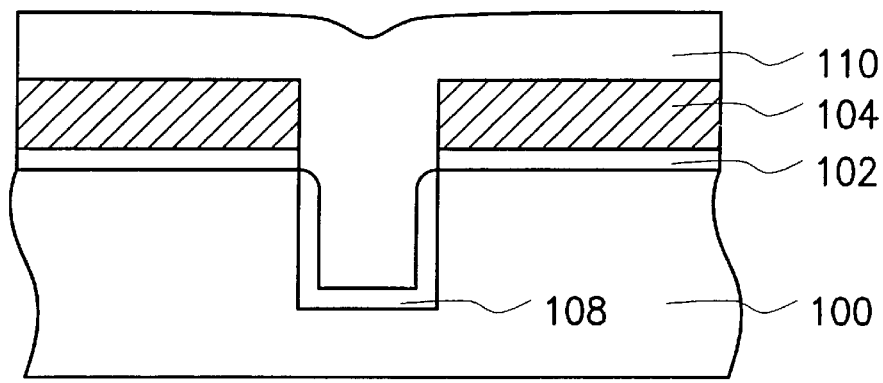
Figure 1C:
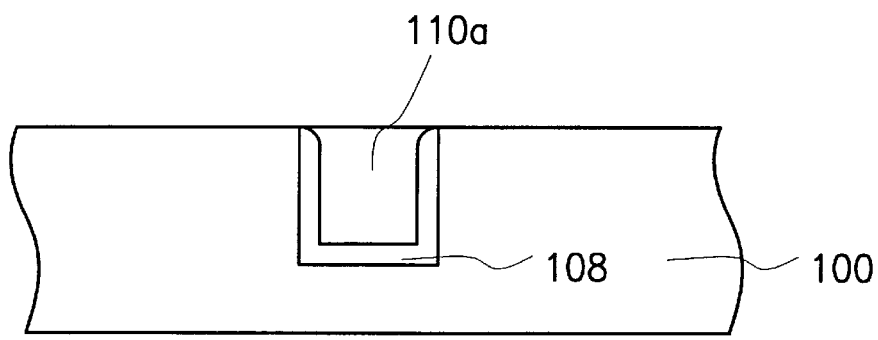
Figure 2A:
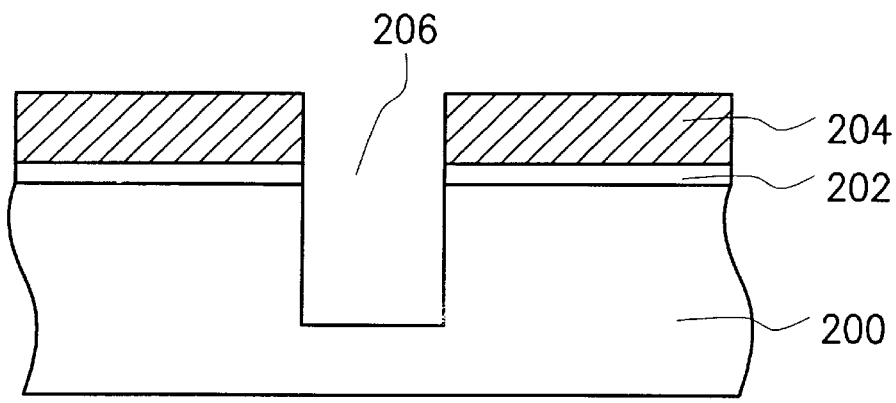
FIGS. 2A through 2C are schematic, cross-sectional drawings representing the process steps of forming shallow trench isolation in accordance with the preferred embodiment of the present invention.
Figure 2B:
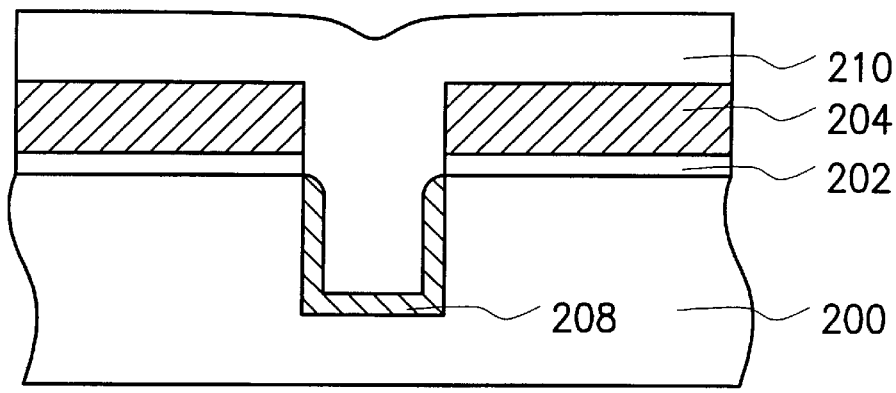
Figure 2C:
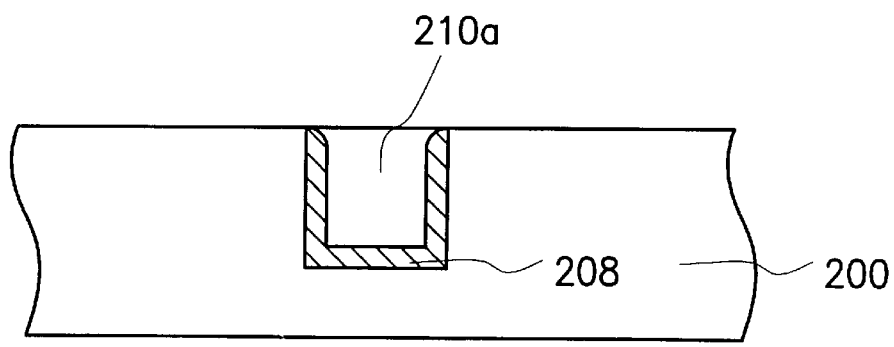

FIGS. 2A through 2C illustrate steps taken in a process to form shallow isolation trench in accordance with the preferred embodiment of the present invention.

Referring to FIG. 2A, a pad oxide layer 202 is formed on the semiconductor substrate 200. The pad oxide layer 202 might, for example, be formed by thermal oxidation to a thickness of about 110–150 Å. A mask layer 204, such as silicon nitride, is formed on the pad oxide layer 202. The mask layer 204 may be deposited to a thickness of about 1500–2000 Å by low-pressure chemical vapor deposition (LPCVD). The mask layer 204 is then patterned by photolithography and etching processes. The pad oxide layer 202 and the substrate 200 are anisotropically etched by using the patterned mask layer 204 as a hard mask in order to form a trench 206 in the substrate 200.

Referring to FIG. 2B, a silicon nitride layer 208, that is a liner layer, is formed on the substrate 200 surface in the trench 206. Put the substrate 200 under a process gas, such as $N_2$ or $NH_3$. Rapid thermal processing (RTP) is processed for about 60 seconds at a temperature of about 1000–1100° C. It makes $N_2$ or $NH_3$ react with silicon atoms of substrate 200 so that a silicon nitride layer 208 is formed. The silicon nitride layer 208 is used to stem the non-bonded oxygen molecular penetrating into the active region of the substrate 200, otherwise it would effect the conductivity of the device. Because the ability of trapping charges or ions for silicon nitride layer 208 is weak, it would reduce the phenomenon of static electricity remaining produced by liner oxide layer in the prior art. Moreover, the forming method of the silicon nitride layer 208 is rapid thermal processing, so the invention has no stress problem which comes from the furnace method which is used to form the silicon nitride layer by Ho et. al.

An insulator layer 210, such as oxide layer, is formed over the mask layer 204 and used to fill the trench 206. The insulator layer 210 is formed by APCVD or HDPCVD, for example. Proceed the densification step to the insulator layer 210 under a high temperature such as about 1000° C.

Referring to FIG. 2C, the mask layer 204 is used as a polish stop layer to remove part of the insulator layer 210, the method comprise CMP. The mask layer 204 and the pad oxide layer 202 are removed sequentially to form an insulator plug 210a in the trench 206.

Depending on the above description, the present invention has advantages as follows:

1. A nitridation reaction occurs on the substrate surface in the trench to form a silicon nitride layer. Because the ability of the charges or ions trapped by the silicon nitride layer is weak, it can reduce the problem of the static electricity remaining.

2. Using the silicon nitride layer as an oxygen barrier layer, it can prevent the non-bonded oxygen molecular from penetrating into the active region of the substrate. And, it would not effect the conductivity of the device.

3. The formation method of the silicon nitride layer is rapid thermal processing anneal, so it has no any stress problem which comes from the furnace method used by Ho et. al.

While the present invention has been described with a preferable embodiment, this description is not intended to limit the invention. Various modifications of the embodiment will be apparent to those skilled in the art. It is therefore contemplated that the appended claims will cover any such modifications or embodiments as fall within the true scope of the invention.

What is claimed is:

1. A method for fabricating a shallow trench isolation structure, comprising:

providing a substrate;

forming a pad oxide layer and a mask layer over the substrate;

patterning the mask layer, the pad oxide layer and the substrate to form a trench in the substrate;

forming a silicon nitride layer directly on the substrate exposed in the trench;

forming an insulating layer over the mask layer to fill the trench; and removing the insulting layer, the mask layer and the pad oxide layer until the substrate is exposed.

2. The method of claim 1, wherein the silicon nitride layer is formed by performing a rapid thermal process under a processing gas.

3. The method of claim 2, wherein the rapid thermal process is performed under about 1000–1100° C.

4. The method of claim 2, wherein the rapid thermal processing is performed for about 60 seconds.

5. The method of claim 2, wherein the processing gas comprises $N_2$.

6. The method of claim 2, wherein the processing gas comprises $NH_3$.

7. The method of claim 2, wherein the material of the insulator layer includes silicon oxide.

8. A method for fabricating a shallow trench isolation in a substrate, wherein a patterned pad oxide layer and a mask layer are formed on the substrate sequentially, and a trench is formed in the substrate, the method comprising:

performing a rapid thermal process under a processing gas to form a silicon nitride layer on the substrate exposed in the trench;

forming an oxide layer over the substrate and to fill the trench; and removing the oxide layer, the mask layer and the pad oxide layer until the substrate is exposed.

9. The method of claim 8, wherein the rapid thermal process is performed at about 1000–1100° C.

10. The method of claim 8, wherein the rapid thermal process is performed for about 60 seconds.

11. The method of claim 8, wherein the processing gas comprises $N_2$.

12. The method of claim 8, wherein the processing gas comprises $NH_3$.

13. A method to prevent an oxygen molecular penetrating into an active region of an substrate and to reduce residual static charge while forming a shallow trench isolation to isolate the active region of the substrate, comprising:

performing a rapid thermal process under a processing gas to form a silicon nitride layer on the substrate exposed in the trench.

14. The method of claim 13, wherein the rapid thermal process is performed at about 1000–1100° C.

15. The method of claim 13, wherein the rapid thermal process is performed for about 60 seconds.

16. The method of claim 13, wherein the processing gas comprises $N_2$.

17. The method of claim 13, wherein the processing gas comprises $NH_3$.

* * * * *